United States Patent [19]
Brion

[11] Patent Number: 4,586,024
[45] Date of Patent: Apr. 29, 1986

[54] WORD STORE EQUIPPED WITH AN ADDRESS CODE CONVERSION CIRCUIT

[76] Inventor: Alain Brion, 15, rue Kermen, F 92140 Clamart, France

[21] Appl. No.: 574,903

[22] Filed: Jan. 30, 1984

[30] Foreign Application Priority Data

Feb. 1, 1983 [FR] France ............... 83 01544

[51] Int. Cl.⁴ .............................. G06F 3/00
[52] U.S. Cl. .............................. 340/347 DD
[58] Field of Search ............ 340/347 DD, 798, 799, 340/750, 801; 364/200, 900; 235/311

[56] References Cited

U.S. PATENT DOCUMENTS 4,231,021 10/1980 Clark et al. ............... 340/347 DD

Primary Examiner—T. J. Sloyan
Attorney, Agent, or Firm—Handal & Morofsky

[57] ABSTRACT

Word store equipped with an address code conversion circuit making it possible to obtain A×B words, A and B not being powers of two. The code conversion circuit is in two parts CTA(X) and CTA(Y), allocated respectively to the code conversion of two addresses X and Y. The first part CTA(X) comprises a multiplexer M(X), which multiplexes the r most significant bits of X with the determined logic level. The second part CTA(Y) comprises a multiplexer M(Y), which multiplexes the r most significant bits of Y (with the exception of the most significant bit) with the r most significant bits of X. The multiplexers are controlled by the most significant bit of one of the addresses. Application to the formation of stores, particularly for graphic or alphanumeric display screens.

5 Claims, 4 Drawing Figures

WORD STORE EQUIPPED WITH AN ADDRESS CODE CONVERSION CIRCUIT

BACKGROUND OF THE INVENTION

Existing stores or memories are organized into words constituted by several bits. The number of words is generally a power of two. As there is often a need for stores having a matrix form, the distribution of these words corresponds to matrixes of $2^p$ by $2^q$ words. In this case, for reading or writing a word in the store, it is merely necessary to display a column address X on a first group of p address wires and a row address Y on a second group of q address wires.

However, it is sometimes desirable to have a store of $A \times B$ words, in which the numbers A and B are not powers of two. This is particularly the case with alphanumeric screen memories, where is a need for $80 \times 24$ characters (or $80 \times 25$) or graphic screen memories with a facsimile format with $1728 \times 2288$ points in which the points are grouped in words of 64 bits, which leads to $27 \times 2288$ word memories.

When A and B are not powers of two, it is possible to write:

$$2^p < A < 2^{p+1}$$

$$2^q < B < 2^{q+1} \qquad (1)$$

p and q being exponents of the closest powers of 2 below A and B.

In other words, this means that A is expressed by p+1 bits and B by q+1 bits. Two cases can occur:

$$\text{if } 2^{p+q+1} < A \times B < 2^{p+q+2} \qquad (2)$$

it is necessary to use a memory with $2^{p+q+2}$ words and it is then necessary merely to respectively increase A and B by $2^{p+1}$ and $2^{q+1}$.

$$\text{if } 2^{p+q} < A \times B < 2^{p+q+1} \qquad (3)$$

it is also possible to use a memory with $2^{p+q+2}$ words, but it would be poorly used, because the half between $2^{p+q+1}$ and $2^{p+q+2}$ would be unused.

SUMMARY OF THE INVENTION

The problem to be solved by the invention is to find a means making it possible to use a memory with a capacity of $2^{p+q+1}$ words, in the special case where each word is defined by a first address with p+1 bits and a second address with q+1 bits.

The invention solves this problem by adding an address code conversion circuit with p+q+2 inputs and p+q+1 outputs. this circuit comprises two parts:

a. a first part constituted by:

p+1 inputs and p+1 outputs, the p+1 inputs receiving p+1 bits defining a number X lower than A, said bits being distributed between a least significant bit and a most significant bit, the p+1 outputs being connected to p+1 first addressing inputs of the memory or store, p+1−r direct connections between the p+1−r inputs allocated to the p+1−r least significant bits and p+1−r outputs, a first multiplexer having a first group of r inputs receiving logic expressions of the r most significant bits of X received by the r corresponding inputs, and having a second group of r inputs raised to the same predetermined logic level, said first multiplexer having r outputs connected to the r remaining outputs of said first part, b. a second part constituted by:

q+1 inputs and q outputs, the q+1 inputs receiving the q+1 bits defining a number Y lower than B, said bits being distributed between a most significant bit and a least significant bit, the q outputs being connected to the q final addressing inputs of the memory, q−r direct connections between the q−r inputs allocated to the q−r least significant bits of Y and q−r outputs, a second multiplexer having a first group of r inputs receiving logic expressions of r most significant bits of Y taken after the most significant bit of Y and having a second group of r inputs connected to the first group of r inputs of the first multiplexer of the first part, said second multiplexer having r outputs connected to the r remaining outputs of said second part, each multiplexer also having a control input receiving the most significant bit of number Y applied to the most significant input of the second part.

Hereinbefore, r is an integer proving the relations:

$$(2^r - 1)2^{p+1-r} \geq A$$

$$2^q + 2^{q-r} \geq B \qquad (4)$$

As a result of this code conversion circuit, the r addressing inputs of the memory which are connected to the outputs of the first multiplexer receive, in accordance with the value of the most significant bit of Y, either r logic expressions of r most significant bits of X, or r predetermined logic levels, the r addressing inputs of the memory which are connected to the inputs of the second multiplexer receiving in the same way either the r most significant bits of Y taken after the most significant bit, or the r most significant bits of X. Thus, address multiplexing takes place on two groups of r addressing inputs.

BRIEF DESCRIPTION OF THE DRAWINGS

The invention is described in greater detail hereinafter relative to non-limitative embodiments and the attached drawings, wherein show.

DETAILED DESCRIPTION OF THE INVENTION

Figure 1:
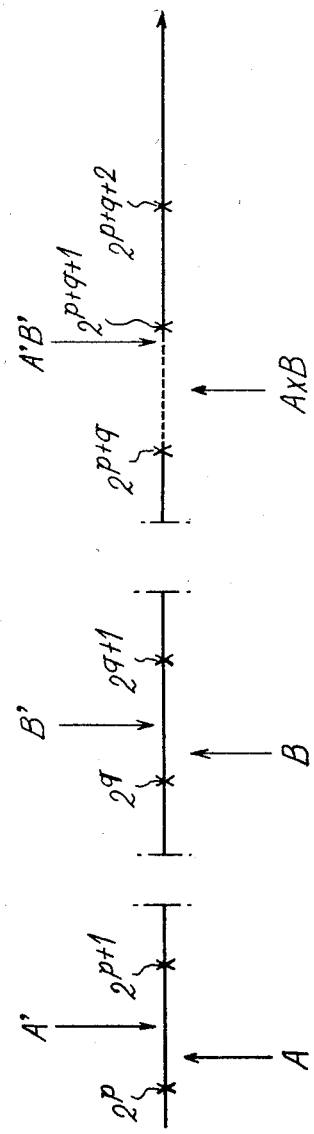
FIG. 1 a diagram showing the respective position of numbers A and B relative to the powers of two.

FIG. 1 is a diagram graphically showing the relative positions of numbers A and B and the product AB. The latter is assumed to be between $2^{p+q}$ and $2^{p+q+1}$ and not between $2^{p+q+1}$ and $2^{p+q+2}$, in which case the only means available would be to use a store having a capacity of $2^{p+q+2}$. Thus, the sphere of application of the invention corresponds to the hached area of the axis.

The idea on which the invention is based is to multiplex certain addresses for reducing from p+q+2 to p+q+1 the number of addressing inputs. This multiplexing is possible by carefully using two groups of r addresses, the number r being defined on the basis of two numbers A' and B' equal to or exceeding A+B, respectively:

$$A' = 2^{p+1-r}(2^r - 1) \geq A$$

$$B' = 2^{q-r}(2^r + 1) \geq B \quad (4)$$

As the number A' is equal to $2^{p+1} - 2^{p+1-r}$, it is consequently lower than $2^{p+1}$. As the number B' is equal to $2^q + 2^{q-r}$, it is less than $2^q + 2^q$, i.e. to $2^{q+1}$. The product A'B' is equal to $2^{p+q+1} - 2^{p+q+1-2r}$. It is consequently between AB and $2^{p+q+1}$. In other words, a memory with A'B' words falls within the scope of the invention and has a capacity exceeding AB. The respective positions of A', B' and A'B' are indicated in the diagram of FIG. 1. Point A'B' is within the hatched area.

Instead of producing a memory of AB words, a memory of A'B' words will be produced by using the special form of the product A'B'.

When the most significant bit of Y is at 1, which gives Y at least the value $2^q$, all the bits of Y with a significance exceeding q−r are necessarily zero, otherwise B' would exceed $2^q + 2^{q-r}$. This makes it possible to multiplex the addresses in the following manner:

p+1−r addressing inputs permanently receive p+1−r least significant bits of the number X below A, q−r addressing inputs permanently receive the q−r least significant bits of the number Y lower than B, r addressing inputs either receive the r most significant bits of X when the most significant bit of Y is at zero, or "1" (i.e. a predetermined logic level) when the most significant bit of Y is at "1", r other addressing inputs receive either the r most significant bits of Y (except its most significant bit) when the most significant bit of Y is at "0", or the r most significant bits of X when the most significant bit of Y is at "1".

To define these questions, the p+1 bits of X should be designated Xo ... Xp (Xo designating the least significant bit and Xp the most significant bit). In the same way the q+1 bits of Y are designated Yo ... Yq (Yo being the most significant bit and Yq the least significant bit). Finally, the p+q+1 addressing inputs of the store are designated Mo ... Mp+q.

Figure 2:
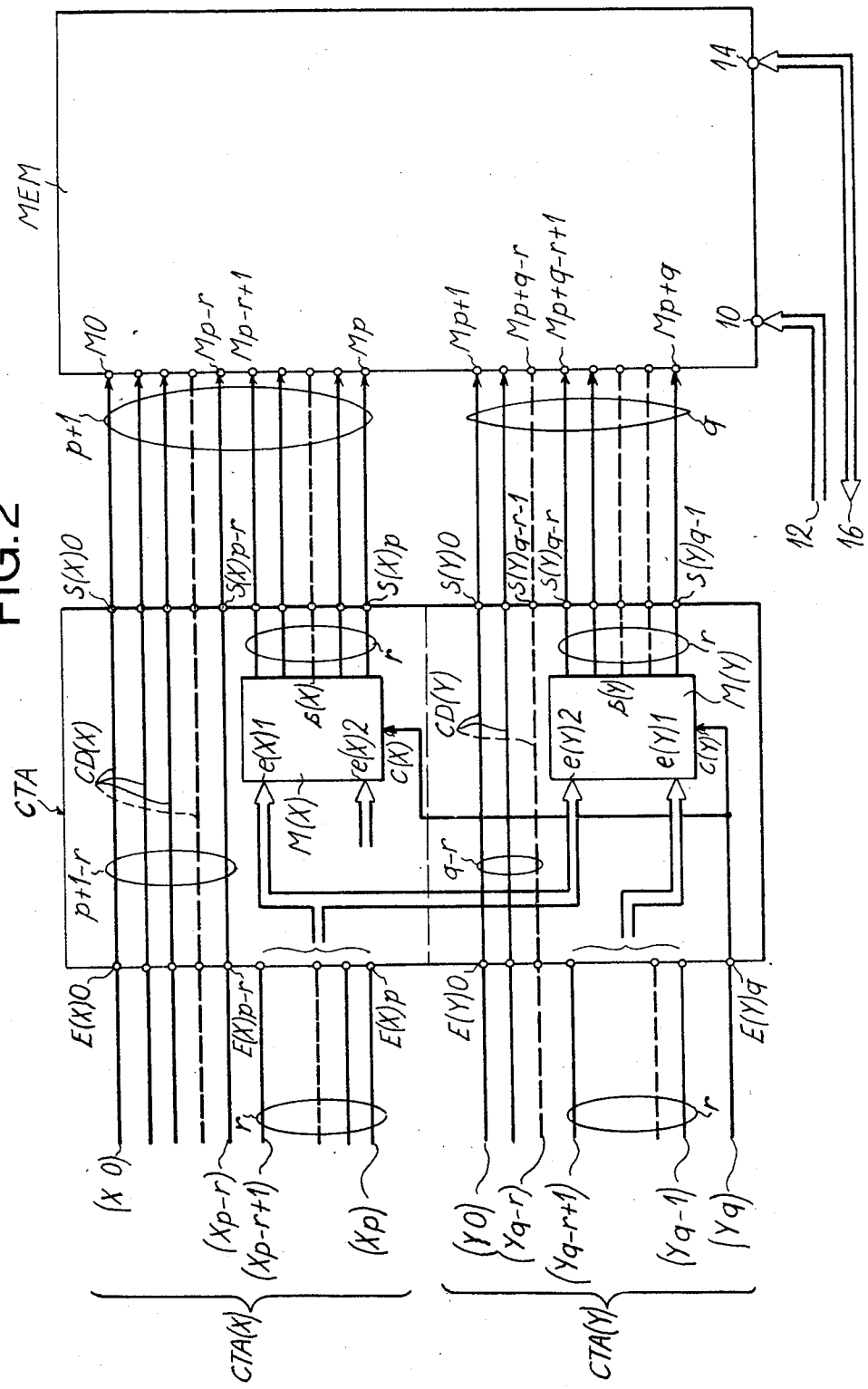
FIG. 2 a general diagram of a store according to the invention.

It is therefore possible to write the correspondence between the addressing inputs and the addressing bits in the following way:

From a specific standpoint, a store designed according to the invention is in the form illustrated in FIG. 2. The actual store or MEM comprises p+q+1 addressing inputs Mo to Mp+q. It is preceded by an address code conversion circuit CTA in two parts, respectively CTA (A) and CTA(Y), which process the numbers X and Y constituting the addresses of the word to be designated from the A×B possible words.

The first part CTA(X) is constituted by: p+1 inputs E(X)o ... E(X)p and p+1 outputs designated S(X)o ... S(X)p, the p+1 inputs receiving the P+1 bits Xo, X1 ... Xp defining the number X, said bits being distributed between a least significant bit Xo and a most significant bit, the p+1 outputs being connected to p+1 first addressing inputs of the memory, i.e. Mo to Mp;

p+1−r direct connections CD(X) between the p+1−r inputs E(X)o ... E(X)p−r allocated to the p+1−r least significant bits Xo ... Xp−r and p+1−r outputs S(X)o ... S(X)p−r;

a first multiplexer M(X) having a first group e(X)1 of r inputs receiving the logic expressions of r most significant bits of X (Xp−r+1 ... Xp) received by the r corresponding inputs E(X)p−r+1 ... E(X)p, the multiplexer having a second group E(x)2 of r inputs raised to the same predetermined logic level, e.g. 1, said first multiplexer finally having r outputs r s(X) connected to the r remaining outputs S(X)p−r+1 ... S(X)p.

The second part CTA(Y) of the code conversion circuit is constituted by:

q+1 inputs E(Y)o ... E(Y)q and q outputs S(Y)o ... S(Y)q−1, the q+1 inputs receiving q+1 bits, namely Yo, Y1, ... Yq defining the number Y, said bits being distributed between a least significant bit Yo and a most significant bit Yq, the q outputs S(Y)o ... S(Y)q−1 being connected to the q final addressing inputs of the memory, namely Mp+1 ... Mp+q;

q−r direct connections CD(Y) between the q−r inputs E(Y)o ... E(Y)q−r allocated to the q−r least significant bits Y and q−r outputs S(Y)o ... S(Y)q−r−1;

a second multiplexer M(Y) having a first group e(X)1 of r inputs receiving the logic expressions of the r most significant bits Yq−r ... Yq−1 of Y taken after the most significant bit Yq and a second group e(Y)2 of r inputs connected to the first group of r inputs of the first multiplexer of the first part, said second multiplexer having r outputs s(Y) connected to the r remaining outputs of said second part, namely S(Y)q−r ... S(Y)q−1.

|  | r | q − r | r | p + 1 − r |
|---|---|---|---|---|
| on: | Mp + q ... M | M ... M | M ... M | M ... Mo |
| if Yq = 0 we find | Yp − 1 ... Yq − r | Yq − r − 1 ... Yo | Xp ... Xp + 1 − r | Xp − r ... Xo |
| if Yq = 1 we find | Xp ... Xp + 1 − r | Yq − r − 1 ... Yo | "1" ... "1" | Xp − r ... Xo |
|  | ↑ ... ↑ |  | ↑ ... ↑ |  |

The multiplexed inputs are designated by arrows.

In order to find the integer r, it is necessary to start with the inequations (4) and the smallest power of two exceeding $B - 2^q$ is sought, which will give $2^{q-r}$. From this is deduced the highest possible value of r and it is established whether the value satisfies the first inequation of inequations (4), relative to A, namely $(2^r - 1) \cdot 2^{p+1-r} \geq A$.

If r exists, it can have several appropriate values and in this case the smallest value is preferably chosen. If r does not exist, the test is repeated by permutating A and B.

Each multiplexer M(X), M(Y) also has a control input, respectively C(X), C(Y), which receives a logic expression of the most significant bit of the number Y, namely Yq, applied to the most significant input E(Y)q of the second part.

The r addressing inputs MP−r+1 ... Mp of the store connected to the outputs of the first multiplexer M(X) consequently receive, as a function of the value of the most significant bit Yq of Y, r logic expressions of the r most significant bits of X, or r predetermined logic levels. In the same way, the r addressing inputs Mp+q−r ... Mp+q of the store, which are connected to the outputs of the second multiplexer, receive either the r most significant bits of Y taken after Yq, or the r most significant bits of X.

Apart from its addressing inputs, the memory MEM naturally has a control input 10 connected to a control bus 12 and a data input 14 connected to a data bus 16.

In the preceding description, the inputs of the multiplexers receive certain bits, but they could obviously also receive their complement. In this case it would merely be necessary to add to the represented circuit, a logic inverter between the code conversion circuit input and the multiplexer input. In the following examples, it is assumed that the inputs of the multiplexers receive the actual bits.

In practice, each multiplexer is constituted by r elementary multiplexers having two inputs and an output. For example it is possible to use the multiplexer 74-LS 158 of Texas Instruments.

Figure 4:
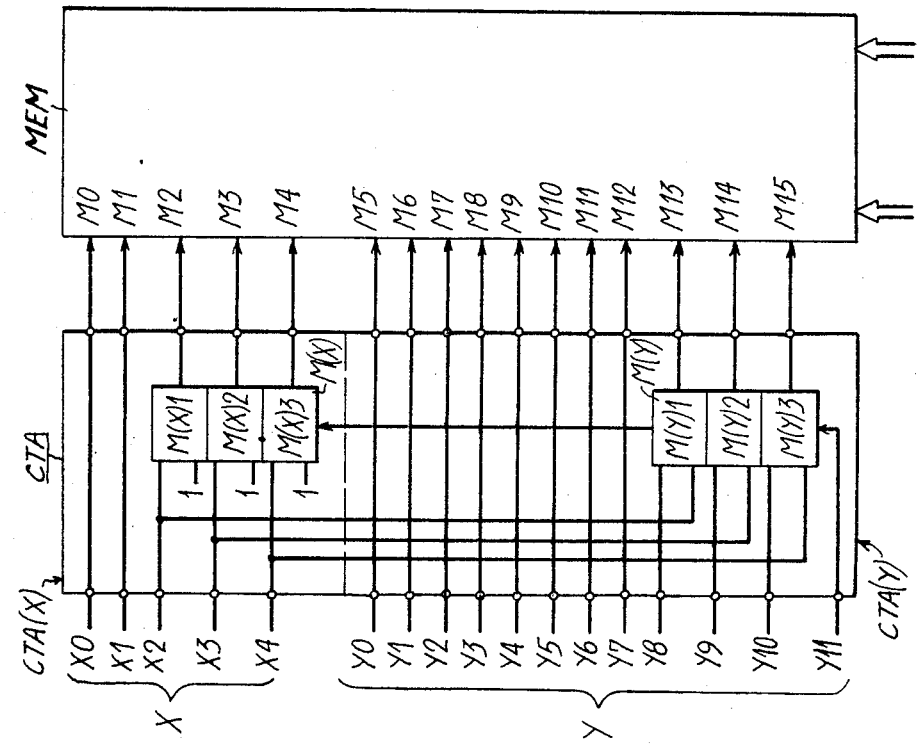
FIG. 4 a special embodiment of a $27 \times 2288$ word store using a 64K word store.

Two embodiments will now be described relative to FIGS. 3 and 4.

The first embodiment corresponds to an alphanumeric display screen memory with 80×24 words using a 2048 word memory. With the preceding notations, we have p=6 and q=4, as well as A=80 and B=24.

The relations defining r are then:

$$A' = (2^r - 1) \times 2^{6+1-r} \geq 80, \text{ and}$$

$$B' = 2^4 + 2^{4-r} \geq 24$$

The second inequation imposes $2^{4-r} \geq 24 - 16$, i.e. $2^{4-r} \geq 8$, thus r=1. Consequently A'=64. As A' does not exceed A, this solution is not suitable.

The test is repeated by permutating the two numbers A and B. Thus, on this occasion we take p=4 and q=6 with A=24 and B=80.

r is sought such that:

$$A' = (2^r - 1) \times 2^{4+1-r} \geq 24, \text{ and}$$

$$B' = 2^6 + 2^{6-r} \geq 80.$$

The second inequation gives $2^{6-r}$ 80−64=16, namely r=2. This means that A'=24, which is suitable. The solution is therefore p=4, q=6, r=2.

The multiplexing diagram is as follows and the multiplexed wires are again marked by an arrow:

|        | M10 | M9 | M8 | M7 | M6 | M5 | M4  | M3  | M2 | M1 | M0 |
|--------|-----|----|----|----|----|----|-----|-----|----|----|----|
| Y6 = 0: | Y5  | Y4 | Y3 | Y2 | Y1 | Y0 | X4  | X3  | X2 | X1 | X0 |
| Y6 = 1: | X4  | X3 | Y3 | Y2 | Y1 | Y0 | "1" | "1" | X2 | X1 | X0 |
|        | ↑   | ↑  |    |    |    |    | ↑   | ↑   |    |    |    |

Figure 3:
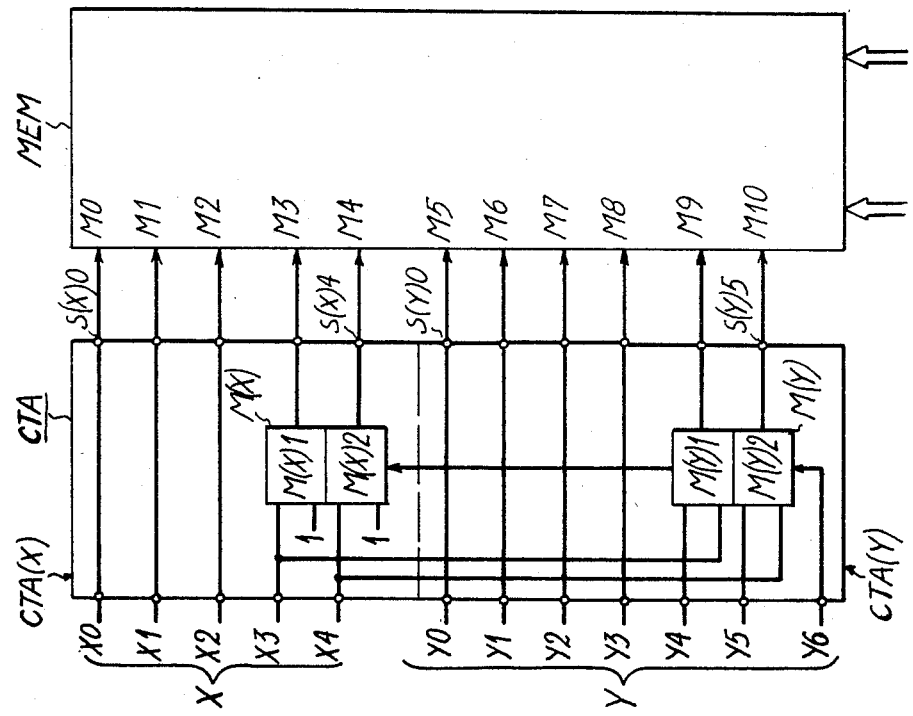
FIG. 3 a special embodiment of a $24 \times 80$ word store using 2048 word store.

Thus, a memory circuit with 24×80 words is obtained and is shown in FIG. 3. It comprises a first multiplexer M(X) constituted by two multiplexers 2→1, respectively M(X)1 and M(X)2 whereof the inputs receive X3 and X4 on the one hand and two logic signals on the other. It comprises a second multiplexer M(Y), which is also constituted by two multiplexers 2→1, respectively M(Y)1 and M(Y)2, whose inputs receive Y4, Y5 on the one hand and X3, X4 on the other. The most significant bit Y6 controls both of them. The memory MEM has 11 addressing inputs M0 to M10. The code conversion circuit CTA has five inputs for address X, namely X0 to X4, six inputs for address Y, namely Y0 to Y5 plus the control inputs Y6 and eleven outputs S(X)0 to S(X)4 and S(Y)0 to S(Y)5.

The second embodiment corresponds to a graphic display screen memory with 27×2288 words using a 64k word memory. In this embodiment, we have p=4 and q=11 as well as A=27 and B=2288.

r is sought such that:

$$A' = (2^r - 1) \times 2^{4+1-r} \geq 27, \text{ and}$$

$$B' = 2^{11} + 2^{11-r} \geq 2288$$

The second inequation gives r=3, hence A'=28, this solution being suitable. Thus, the following multiplexing diagram is obtained:

|         | M15 | M14 | M13 | M12 | M11 | M10 | M9 | M8 | M7 | M6 | M5 | M4  | M3  | M2  | M1 | M0 |
|---------|-----|-----|-----|-----|-----|-----|----|----|----|----|----|-----|-----|-----|----|----|
| if Y11 = 0 | Y10 | Y9  | Y8  | Y7  | Y6  | Y5  | Y4 | Y3 | Y2 | Y1 | Y0 | X4  | X3  | X2  | X1 | X0 |
| if Y11 = 1 | X4  | X3  | X2  | Y7  | Y6  | Y5  | Y4 | Y3 | Y2 | Y1 | Y0 | "1" | "1" | "1" | X1 | X0 |
|         | ↑   | ↑   | ↑   |     |     |     |    |    |    |    |    | ↑   | ↑   | ↑   |    |    |

In this way, we obtain a memory with 28×2304 words, namely 1792×2304 points. Each word can consist of 64 bits in the case of the graphic display application. FIG. 4 shows the circuit obtained. The address code conversion circuit has five inputs allocated to X (X0 to X4) and twelve inputs allocated to Y (Y0 to Y11). The multiplexers M(X) and M(Y) each comprise three multiplexers 2→1. The first multiplexer elements X2, X3, X4 with the same logic level "1" and the second multiplexer elements Y8, Y9, Y10 with X2, X3, X4. The multiplexing control is provided by Y11.

What is claimed is:

1. A store for storing A×B words, in which A and B are numbers proving the inequations:

$$2^p < A < 2^{p+1}$$

$$2^q < B < 2^{q+1}$$

$$2^{p+q} < A \times B < 2^{p+q+1}$$

in which p and q are integers, wherein it comprises p+q+1 addressing inputs connected to an address code conversion circuit (CTA) which is in two parts:
(a) a first part (CTA)X constituted by:
p+1 inputs E(X)0 ... E(X)p and p+1 outputs S(X)0 ... S(X)p, the p+1 inputs receiving p+1 bits (X0 ... Xp) defining a number X lower than A, said bits being distributed between a least significant bit X0 and a most significant bit Xp, the p=1 outputs being connected to p+1 first addressing inputs (M0 ... Mp) of the store MEM, $p=1-r$ direct connections CD(X) between the $p=1-r$ inputs allocated to the $p+1-r$ least significant bits of X and $p+1-r$ outputs;

a first multiplexer M(X) having a first group E(X)1 of the r inputs receiving logic expressions of the r most significant bits $(Xp-r+1 \ldots Xp)$ of X received by the r corresponding inputs, and a second group e(X)2 of r inputs raised to the same predetermined logic level, said first multiplexer having r outputs s(X) connected to the r remaining outputs of said first part;

b. a second part CTA(Y) constituted by:

$q+1$ inputs E(Y)0 ... E(Y)q and q outputs S(Y)0 .. . S(Y)q−1, the q+1 inputs receiving the q+1 bits (Y0 ... Yq) defining a number Y less than B, said bits being distributed between a least significant bit Y0 and a most significant bit Yq, the q outputs being connected to the q final addressing inputs (Mp+1 ... Mp+q) of the memory;

$q-r$ direct connections CD(Y) between the $q-r$ inputs allocated to the $q-r$ least significant bits Y and $q-r$ outputs;

a second multiplexer M(Y) having a first group e(Y)1 of r inputs receiving logic expressions of the r most significant bits $(Yq-r+1 \ldots Yq-1)$ of Y taken after the most significant bit of Y (Yq) and a second group e(Y)2 of r inputs connected to the first group of r inputs e(X)1 of the first multiplexer M(X) of the first part, said second multiplexer having r outputs s(Y) connected to the r remaining outputs $s(X)q-r \ldots S(Y)q-1$ of said second part;

each multiplexer also having a control input C(X), C(Y), which receives the most significant bit Yq of the number Y applied to the most significant input E(Y)q of the second part, the r addressing inputs $(Mp-r+1 \ldots Mp)$ of the store connected to the outputs of the first multiplexer M(X) thus receiving, according to the value of the most significant bit Yq of Y, either r logic expressions of the r most significant bits $(Xp-r+1 \ldots Xp)$ of X, or r predetermined logic levels and the r addressing inputs $(Mp+q-r+1 \ldots Mp+q)$ of the store connected to the outputs of the second multiplexer M(Y), receiving in the same way either the r most significant bits of Y taken after the most significant bit $(Yq=r+1 \ldots Yq-1)$, or the r most significant bits of X $(Xp-r+1 \ldots Xp)$, whereby hereinbefore r is an integer proving the relations:

$$(2^r-1)2^{p+1-r} \geq A$$

$$2^q + 2^{q-r} \geq B.$$

2. A store according to claim 1, wherein each multiplexer M(X), M(Y) is constituted by r multiplexers 2→1.

3. A store according to claim 1, wherein the logic expressions of the bits are the bits themselves.

4. A store according to claim 1, wherein it is able to process 24×80 words and wherein it comprises a memory with 11 addressing inputs, and a code conversion circuit incorporating a first part having five inputs, five outputs and two multiplexers 2→1, as well as a second part with six addressing inputs, one control input and six outputs, as well as two multiplexers 2→1.

5. A memory according to claim 1, wherein it is able to process 27×2288 words and comprises a store having 16 addressing inputs and an address code conversion circuit incorporating a first part with five inputs, five outputs and three multiplexers 2→1, and a second part having eleven addressing inputs, a further control input, eleven outputs and three multiplexers 2→1.

* * * * *